United States Patent
Ernst

(10) Patent No.: US 9,829,516 B1
(45) Date of Patent: Nov. 28, 2017

(54) NON-INTRUSIVE TRANSIENT POWER DETECTION SYSTEM

(71) Applicant: Amazon Technologies, Inc., Seattle, WA (US)

(72) Inventor: Richard Bradley Ernst, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 525 days.

(21) Appl. No.: 14/494,475

(22) Filed: Sep. 23, 2014

(51) Int. Cl.
*G01R 21/00* (2006.01)
*G01R 19/00* (2006.01)

(52) U.S. Cl.
CPC ......... *G01R 21/00* (2013.01); *G01R 19/0084* (2013.01); *G01R 19/0092* (2013.01)

(58) Field of Classification Search
CPC ...... G01R 15/202; G01R 1/07; G01R 31/343; G01R 21/00; G01R 19/0084; H01L 24/34
USPC .......... 324/76.11, 750.01, 509, 426, 437, 96, 324/762.01–762.1, 97, 74
See application file for complete search history.

(56) References Cited

U.S. PATENT DOCUMENTS

| | | | |
|---|---|---|---|
| 2011/0310585 A1* | 12/2011 | Suwa | H05K 7/20927 361/820 |
| 2014/0266784 A1* | 9/2014 | Ratcliff | G01D 4/004 340/870.03 |

* cited by examiner

Primary Examiner — Melissa Koval
Assistant Examiner — Trung Nguyen
(74) Attorney, Agent, or Firm — Thorpe North & Western, LLP.

(57) ABSTRACT

A technology is described for a non-intrusive power detection system. An example system may include a non-intrusive power detector configured to be electrically coupled to an alternating current (AC) power line to non-intrusively detect at least one of an alternating current or a voltage in the AC power line. A power change trigger may be coupled to the non-intrusive power detector and configured to detect a change in power in the AC power line. An indicator may be coupled to the power change trigger. The indicator may be configured to indicate when a power change occurs based on an output of the power change trigger.

20 Claims, 5 Drawing Sheets

NON-INTRUSIVE TRANSIENT POWER DETECTION SYSTEM

BACKGROUND

The use of large scale computing resources has revolutionized the world of computing. Small, lightweight, low power mobile computing devices may rely on the use of the large scale computing resources to perform heavy duty processing, thereby minimizing the amount of power expended at the mobile computing device. In addition, large scale computing resources may provide enormous databases and store exponential amounts of accessible information that enable our modern technical infrastructure to operate.

The operation of the large scale computing devices typically involves operating thousands of servers in large server farms, along with the network switches, routers and other devices used to enable communication within the server farm and with the end users of the server farm. Each server farm may support thousands or even millions of end users. Accordingly, it is important that each server farm is highly available and has minimal down time.

To maintain a high level of reliability within a server farm, a great amount of redundancy is often employed. In addition to backup servers that may be employed in case of the failure of another server, backup power is also used. The use of backup generators and uninterruptable power supplies (UPS) may be used to reduce the inherent instability of power received from power stations. Integrated sensors in server farms may also be used to monitor power distribution to equipment within the server farm.

However, changes in phase, voltage, and current that intermittently occur in power received from power stations may reduce the reliability of the electronic equipment used in server farms. The use of integrated sensors in each of thousands of devices operating at the server farm may be expensive and cause additional points of failure, and integrated sensors may report on a limited number of power problems. The use of integrated sensors may actually make it difficult to monitor the power throughout the server farm and decrease the overall reliability of the server farm.

DETAILED DESCRIPTION

Figure 1A:
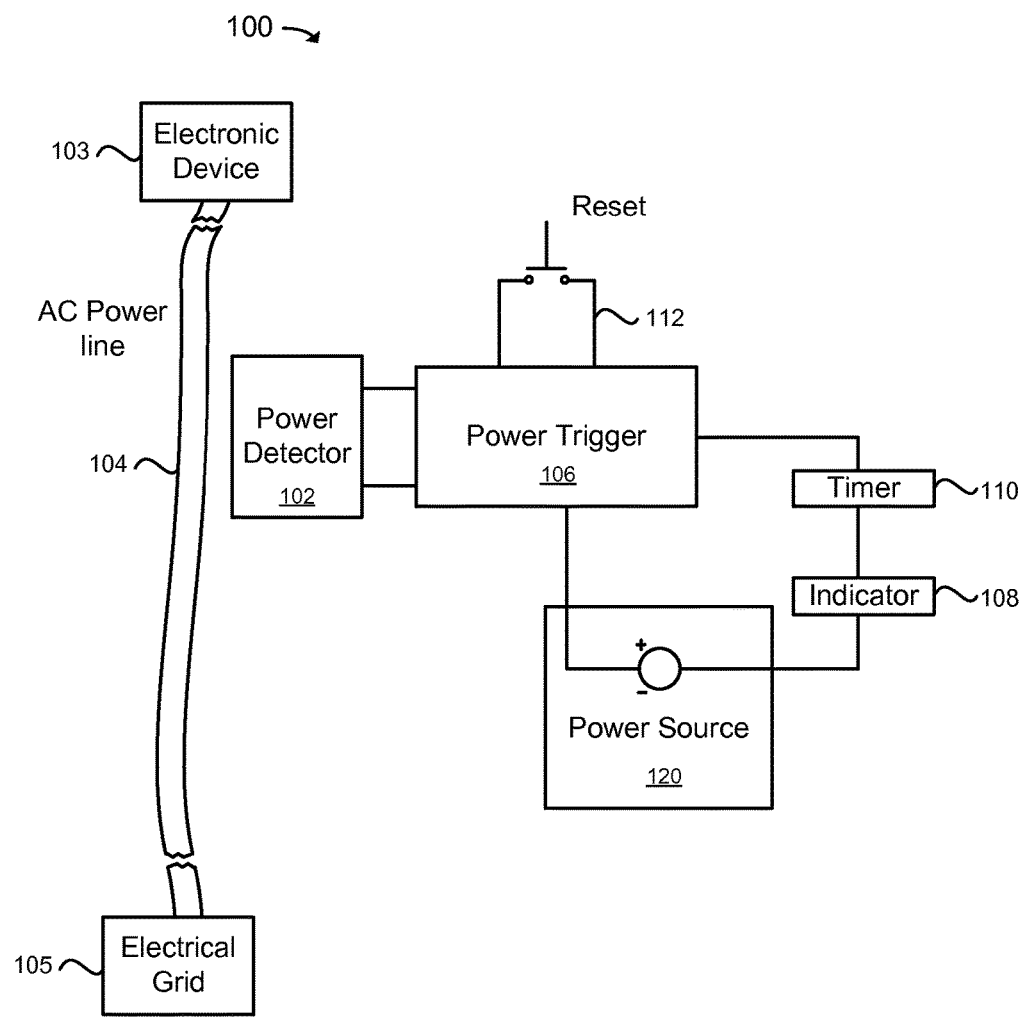
FIG. 1a is a block diagram illustrating an example non-intrusive power detection system.

The present technology provides a relatively inexpensive, non-intrusive power detection system that may be used to detect and identify one or more electronic devices that may be affected with AC power issues, such as voltage drops, current drops, power outages, or phase issues that may cause changes in voltage or current levels at the electronic device. In one example, the technology may be coupled to or wrapped around AC power cords or AC power lines connected to electronic devices. In an additional example, the non-intrusive power detection system may be configured to identify brief changes in voltage or current, on the order of tens of milliseconds, which may affect the electronic devices. Due to the fact that the technology is placed in proximity of a power cord or power line and is not wired into the power circuit, the non-intrusive power detection system does not create an additional point of failure for the electronic devices.

The non-intrusive power detection system may provide visual and/or audio alerts to help identify where problems exist. For example, a visual alert using a light may indicate to an administrator that a power line to a server or a group of servers has had a transient power issue. The relatively low cost of the non-intrusive power detection system allows the non-intrusive power detection system to be used with hundreds or thousands of electronic devices. When brief changes in the AC power occur repeatedly, the source of the problems may be more easily detected and fixed by identifying the location of the electronic device where the transient power issues occur. The ability to locate and correct AC power issues may significantly enhance the robustness of an environment, such as a server farm, by enabling the infrastructure to be steadily improved. This non-intrusive power detection system may further enhance the capability to maintain a server farm's operational status with extended periods of up-time.

This technology may be useful in certain environments, such as server farms, where a large amount of power is used to power thousands of complex electronic devices, such as servers, switches, and routers, where even minor problems, such as brief changes in voltage, current, or phase in alternating current (AC) power may create substantial issues with complex and delicate electronic devices. The minor problems are often temporary and sporadic, and such transient power issues may be difficult to detect, locate, and reproduce. Thus, this technology may detect temporary and sporadic issues with AC power that may cause an inherent instability in the operation of electronic devices such as servers, switches and routers at a server farm.

This technology avoids the use of integrated sensors in each of thousands of electronic devices operating at a server farm that may be expensive and may cause additional points of failure. The use of integrated sensors in existing devices may make monitoring the power delivered to electronic equipment operating throughout the server farm more difficult, and integrated sensors may report on a limited number of power problems, thereby decreasing the overall reliability of the equipment. Thus, the present technology may assist in the identification of transient power and AC power problems that are otherwise difficult to isolate with existing integrated power sensors and similar in-device power sensing equipment.

A technology is described for providing a non-intrusive power detection system 100 for an electronic device 103 or electronic equipment connected to an alternating current (AC) electrical grid 105, as illustrated in one example in the block diagram of FIG. 1a. The electrical grid 105, as used herein, refers to an interconnected network for delivering electricity from suppliers to consumers. The electrical grid 105 may include generating stations that produce electrical power, high-voltage transmission lines that carry power from distant sources to demand centers, and distribution lines that connect to individual customers. In addition, the electrical grid 105 may also comprise private power generation schemes, such as the use of generators.

The non-intrusive power detection system 100 may include a non-intrusive power detector 102. The non-intrusive power detector 102 may be positioned in proximity of an AC power cord 104 or AC power line. As used herein, an AC power cord is a conductive cable with two or more conductors that are configured to carry alternating current. The AC power cord has a first side that is electrically connected to an electronic device 103 or a power distribution device (i.e. power strip) and a second side that includes a plug that may be connected to an electrical outlet connected to the AC power grid 105. An AC power line is also a conductive cable with two or more conductors that are configured to carry alternating current. The AC power line has a first side that is electrically connected to an electronic device 103 or a power distribution device, and a second side that is electrically connected to the AC power grid 105.

The non-intrusive power detector 102 may be configured to detect the presence of AC current and/or voltage in the AC power cord 104 non-intrusively, for example, without the need to be directly connected in parallel or series with the hot and neutral electrical leads of the AC power cord 104. The non-intrusive power detector 102 may be positioned in proximity of an AC power cord or electrically coupled to the AC power cord. As used herein, the term electrically coupled may include physically connecting the non-intrusive power detector 102 to an electrical outlet connected to the AC power cord 104 or placing the non-intrusive power detector 102 within a proximity of at least one conductor of the AC power cord to allow the voltage and/or current to be detected using non-intrusive measurements. Various embodiments of the non-intrusive power detector will be discussed in more detail in the following paragraphs.

A power change trigger 106 may be coupled to the non-intrusive power detector 102 and configured to detect a change in power in the AC power cord 104. The change in AC power may be due to a change in the AC current or a change in the AC voltage. Threshold levels for changes in the current and/or voltage values may be set for the power change trigger to send an output signal. When a change in the AC power within the AC power cord 104 occurs, the power change trigger 106 may be configured to output a signal to indicate that the threshold value has been crossed.

For example, a threshold value for voltage may be set to a level that may be dangerous to electronic devices and/or power supplies within the electronic devices. For example, a value of greater than 140 volts or less than 90 volts for more than a few milliseconds may be damaging to components such as capacitors and resistors in a direct current (DC) power supply in an electronic device such as a server that is configured to operate at 120 volts. Alternatively, the power change trigger 106 may be set to a narrower range for voltage changes to help ensure that the voltage supplied to the electronic devices is maintained within a desired range. This example is not intended to be limiting. The threshold value may be set for any upper and/or lower threshold value that may be damaging to electronic equipment or is of interest to an operator of the equipment.

In another example, the power change trigger 106 may be configured to output a signal when a change in current in the AC power cord 104 is detected using the non-intrusive power detector 102. The change in current identified by the power change trigger 106 may also be within a predetermined threshold range, depending on the current draw of the electronic device for which power is supplied by the AC power cord 104. The measurement of the change in current may depend on the way in which the current is measured by the power detector. This will be discussed in subsequent paragraphs.

In one example, the power change trigger 106 may be configured to identify when current ceases to flow in the AC power cord 100, thereby causing a power outage at the electronic device 103. In one example, the power change trigger 106 may be a falling edge latch type of trigger that is configured to output a signal when an alternating current in the AC power cord 104 ceases. Due to the nature of alternating current, the falling edge latch may be configured to output a signal when the current ceases for a period longer than the frequency of the alternating current. For instance, a 60 Hertz alternating current has a duty cycle of 16 milliseconds (ms). The falling edge latch may be configured to output a signal when a current of a selected polarity, such as a positive or negative polarity, is not detected for a period that is longer than 16 ms. For example, when a current flow ceases for a period of 20 ms or longer, the power trigger may output a signal. This example is not intended to be limiting. The power trigger may be comprised of different types of latches, such as a rising edge latch or a variety of analog or digital circuits that may be used to monitor an output of the power detector and identify when a voltage of the AC power cord 104 or AC current flowing in the AC power cord 104 is outside of a selected threshold range or is not present for a selected time period.

In one configuration, an output of the power change trigger 106 may be sent to an indicator 108. The indicator 108 may indicate, either visually or audibly, that the AC power in the AC power cord 104 is not present or is outside of a selected threshold range. For example, the indicator 108 may be a light emitting diode, incandescent light or other light emitting device to provide a visual indication. Thus, a system administrator may visually diagnose whether an electronic device, such as a server, is having a power issue.

Alternatively, the indicator may be an audible device, such as a piezoelectric speaker or other type of audio source to provide an audible indication when AC power is not present or is outside of a selected power threshold range. An audible device may allow a system administrator to walk around a facility containing servers or server racks and audibly determine whether certain servers are having power issues.

While visual and audible sources are provided as examples of indicators, the examples are not intended to be limiting. Anything that may be used to indicate to a user that the AC power is not present or is outside of a selected power threshold range may be used, including chemical changes, electro-chemical changes such as a liquid crystal display, mechanical changes such as a spring loaded indicator, an e-ink display and so forth. These mechanical changes are included as being in either the visual or audible categories, as can be appreciated.

In one example, an output of the power change trigger 106 may be sent to a timer 110. The timer 110 may then be configured to communicate a signal to the indicator 108 after an output of the power change trigger 106 indicates that the power change has occurred for a threshold amount of time, to indicate that the power change comprises a change in the voltage and/or the alternating current in the AC power cord for the threshold amount of time. The timer may be useful to avoid the indications of very brief changes in the AC voltage or AC current.

For example, a very brief change in an AC voltage level that is outside of a desired threshold voltage range may not be damaging to electronic devices. Specifically, a static charge of several kilovolts may be passed through the AC power cord 104. The duration of the static charge may be on the order of a few microseconds and comprise very little current, resulting in little or no effect on the electronic device receiving power from the AC power cord. Similarly brief changes in current may be filtered out by the timer 110.

The actual threshold value of the timer 110 may depend on the type of electronic device the AC power cord 104 is connected to and the sensitivity of the device to changes in AC power. The threshold time for the timer may vary from tens of microseconds to hundreds of milliseconds or longer. Once the change in AC voltage or AC current occurs for longer than the threshold time, the timer 110 may send a signal to the indicator 108 to provide an indication, as previously discussed.

While the timer 110 is shown to be separate from the power change trigger 106, this is not intended to be limiting. As may be appreciated, the timer 110 may also be integrated with the power change trigger 106, thereby enabling the power change trigger 106 to output a signal to the indicator 108 after the change in AC voltage or AC current occurs for longer than the threshold time.

A reset switch 112 may be coupled to the power change trigger 106 and/or the timer 110. The reset switch 112 may be used to manually reset the indicator 108 after the indicator 108 was tripped to indicate that the change in AC voltage or AC current in the AC power cord 104 occurred outside of the predetermined threshold levels. Once the reset switch 112 is used to reset the power change trigger 106 and/or the timer 110, the indicator may no longer indicate that a change in AC voltage or AC current in the AC power cord has occurred. The reset may be a mechanical or electrical switch that is used to stop the output signal of the power trigger and/or timer and reset the power trigger and/or timer to an initial condition. Alternatively, the reset button can be configured to automatically reset the non-intrusive power detector system after a selected period of time, such as after 10 minutes, 1 hour, 1 day, 1 week, or so forth. The automatic reset time period may be selectable by a user. The ability to automatically reset the non-intrusive power detector system can be important when a power issue occurs that affects a large number of electronic devices. It may be difficult and time consuming to reset hundreds or thousands of non-intrusive power detector systems.

The non-intrusive power detector system 100 may further comprise a power source 120. The power source may be used to provide power to the power change trigger 106, the reset switch 112, the timer 110, the indicator 108, and/or the power detector 102 to enable the non-intrusive power detector system to operate. In one example, the power source 120 may be comprised of a chemical battery such as a button battery. Alternatively, the power source 120 may be a capacitor that may be recharged via power received at the power change detector 102 from the AC power cord 104. In addition, a combination of batteries and/or capacitors may be used. The battery may be rechargeable or a one-time use battery.

Figure 1B:
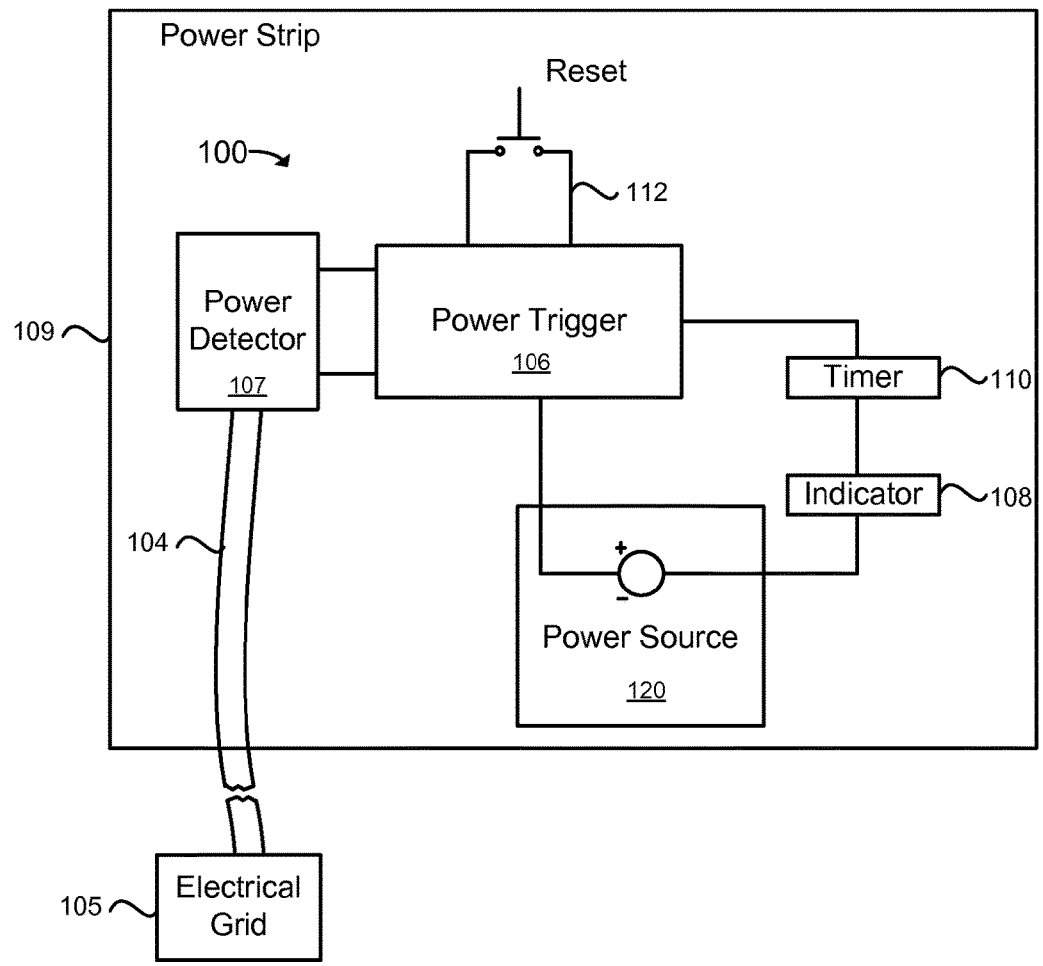
FIG. 1b is a block diagram illustrating an example non-intrusive power detection system used with a power strip.

In another example, the non-intrusive power detector system 100 may be coupled to a power strip 109 having a plurality of electrical outlets that is connected to an electrical grid 105 via an AC power cord 104, as illustrated in FIG. 1b. For instance, the non-intrusive power detector system 100 may be plugged into an electrical outlet (i.e. socket) of the power strip 109.

In the example of FIG. 1b, the power detector 107 may be a current detector and/or a voltage detector that may be used to measure the current or voltage at a selected electrical outlet in a power strip 109. The current detector may detect when current is available or not available at the power strip. The voltage detector may be used to determine when a voltage at the power strip 109 is less than or greater than a predetermined voltage threshold range. The reset 112, power trigger 106, timer 110, and power source 120 can operate as previously discussed in FIG. 1a. The indicator 108 can be integrated in the power strip and configured to be viewable by the user. In addition, the non-intrusive power detector system 100 can be integrated into the power strip 109.

Figure 2:
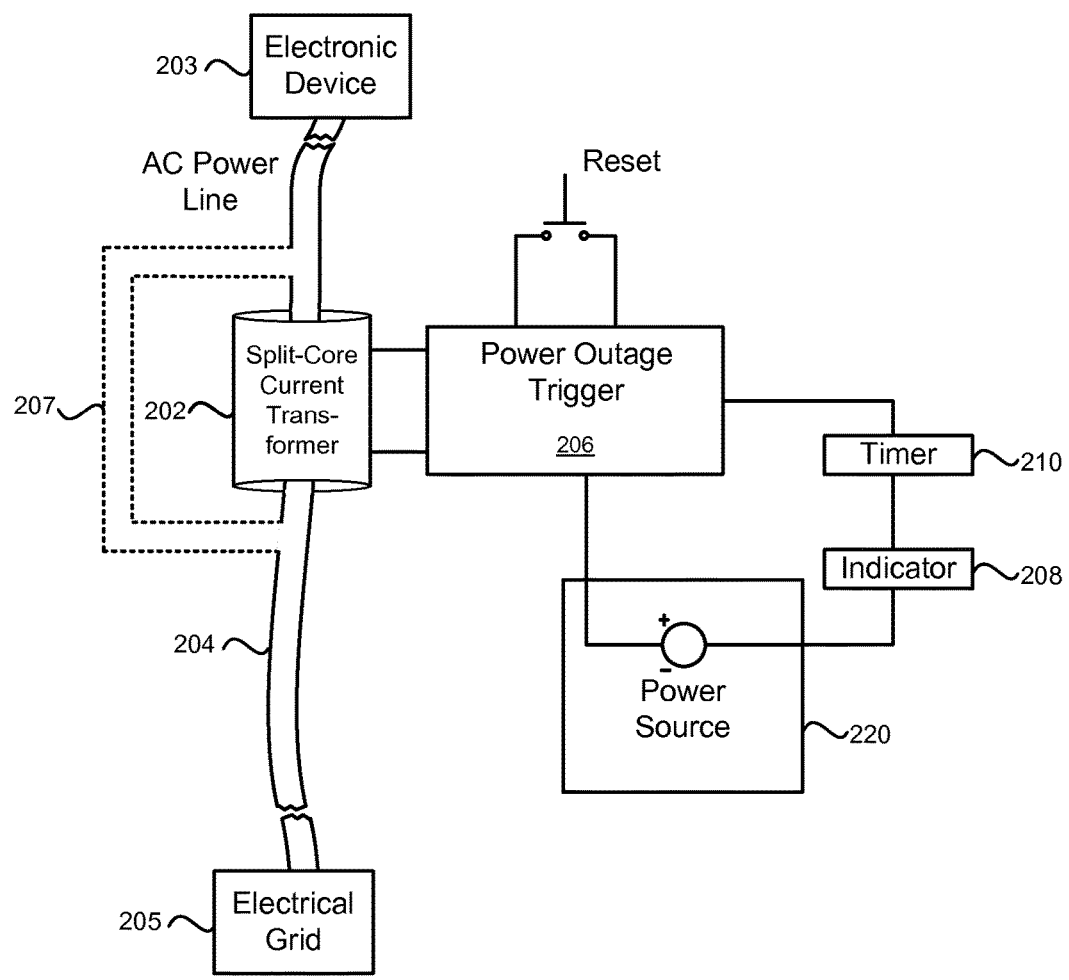
FIG. 2 is a block diagram illustrating an example non-intrusive current detection system.

FIG. 2 illustrates an example of the non-intrusive power detection system 200 in which the power detector is a split-core current transformer 202. The split core current transformer may wrap around an AC power line 204, such as an AC power cord, as shown in FIG. 2. The AC power line or AC power cord 204 typically includes a hot conductor and a return conductor. The AC power line or AC power cord 204 can also include a ground conductor and a neutral conductor. The alternating current in the AC power line 204 may induce a varying magnetic flux. The varying magnetic flux may then induce a varying magnetic current in the split-core current transformer 202 that is proportional to the current in the AC power cord. In one embodiment, the split-core current transformer 202 may wrap around each of the conductors in the AC power line 204. However, if the return conductor is in phase with the hot conductor, the return conductor may effectively cancel a significant amount of the varying magnetic flux in the hot conductor. Accordingly, one or more of the conductors and/or a ground wire can be routed externally 207 around the split-core current transformer. For instance, the hot conductor may run through the split-core current transformer 202. Alternatively, the hot, ground, and neutral conductors may run through the split core-current transformer 202 and the return conductor can be routed externally. Other combinations are also available, as can be appreciated. Typically, separating the hot conductor and neutral conductor, such that one of the conductors is routed external to split-core current transformer 202 can increase the amount of current that is sensed by the split-core current transformer 202.

The amount of current in the split-core current transformer 202 may be measured using a sense resistor to produce an AC voltage that is proportional with the current. The AC voltage may then be sent to the power outage trigger 206. The power outage trigger 206 may send an output signal when the current is not detected for a selected period of time. If the AC voltage is not measured for a period longer than a phase of the AC current in the AC power line 204, then the power outage trigger 206 may be configured to send an output signal to an indicator 208, as previously discussed.

The power outage trigger 206 may also be configured to send an output signal or message to a timer 210. The timer 210 may then be configured to communicate a signal to the indicator 208 after an output of the power outage trigger 206 indicates the power outage for a threshold amount of time. The timer 210 may then send an output signal to an indicator 208, as previously discussed. A power source 220 may be used to provide power to one or more components in the non-intrusive power detection system 200, as previously discussed.

The split-core current transformer 202 may be used to identify when AC current is not flowing within the AC power line 204. The non-intrusive power detection system 200 may identify when power outages lasting longer than a selected time threshold have occurred. Sporadic or transient outages caused by phase problems, voltage problems, grounding problems, or other power issues within the AC power line 204 or the electrical grid 205 may be detected and indicated to a user. The user may then use this information to correct the problems that may damage or reset an electronic device 203 such as a server, a switch, a router, or other type of electronic device.

Figure 3:
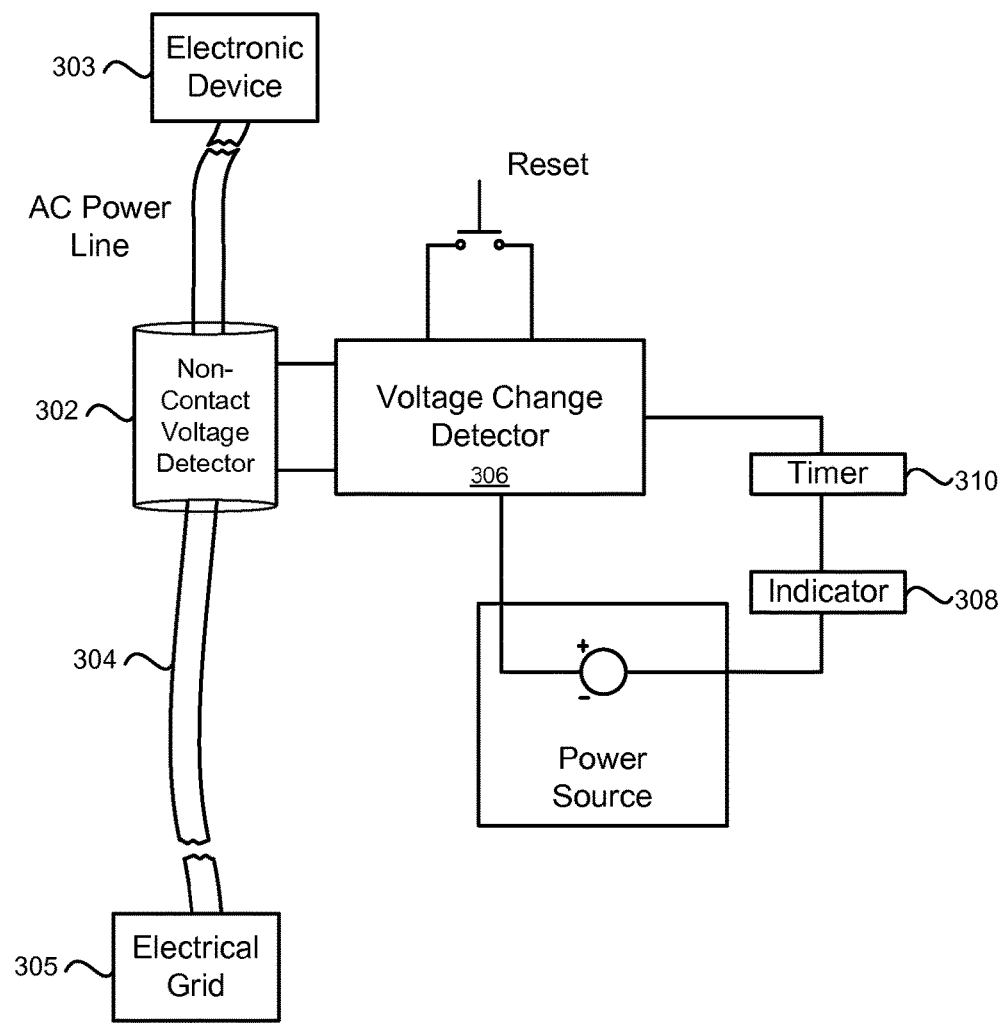
FIG. 3 is a block diagram illustrating an example non-intrusive voltage detection system.

FIG. 3 illustrates an example of the non-intrusive power detection system 300 in which the power detector is a non-contact voltage detector 302. The non-contact voltage detector may be placed around an AC power line 304, such as an AC power cord or power line, as shown in FIG. 3. The non-contact voltage detector may also be incorporated in a housing of a power connector, such as a plug on the AC power cord. The non-contact voltage detector 302 may be used to determine a voltage level of an AC voltage in the AC power line 304.

In one example, the non-contact voltage detector 302 may be comprised of a plurality of capacitive voltage sensors. Capacitive voltage sensors may comprise two capacitors in series that may operate as a voltage divider. The largest voltage may develop across the largest impedance (i.e. the smallest capacitance). A single capacitive voltage sensor may be used to identify that there is a voltage in the AC power line 304. Thus, a single capacitive voltage sensor may be used to identify that AC power is, or is not, available in the AC power line. The voltage change detector 306 may then output a signal to the timer 310 and/or the indicator 308 to indicate that no voltage is present at the AC power line 304. The term "no voltage", as used herein, infers that substantially no voltage is present in the AC power line. While some voltage may still exist, the voltage is not sufficient to operate the electronic device 303.

In addition, a plurality of capacitive voltage sensors in the non-contact voltage detector 302, which are each placed at a predetermined distance from the conductors in the AC power line 304, may be used to determine a voltage level in the AC power line 304. The plurality of capacitive voltage sensors may be used to measure an electric field associated with the voltage on the AC power line. The electric field is directly proportional to a magnitude of voltage present on the AC power line.

The non-contact voltage detector 302 comprising a plurality of capacitive voltage sensors may output a signal to the voltage change detector 306 indicating an approximate voltage level in the AC power line 304. The voltage change detector 306 may be configured to output a signal to the timer 310 and/or indicator 308 when the voltage level in the AC power line 304 is greater than or less than a selected voltage level for a threshold period of time, as previously discussed.

The indicator 308 may indicate when voltage spikes, brownouts, and/or blackouts occur in the AC power line 304. When voltage spikes, brownouts, and/or blackouts occur repeatedly, the non-intrusive power detection system 300 may be used to identify when and where these changes in voltage occur. This information may be especially helpful in an environment with a large amount of electronic equipment, such as a server farm. The ability to identify a location of voltage changes in a server farm may assist a user in correcting such fluctuations in voltage that may be damaging to equipment or cause the equipment to repeatedly reset or have other intermittent problems, thereby reducing the up-time of servers in a server farm.

The indicator 308 may be a simple indicator that can change between two states, with a first state indicating that a voltage change greater than a selected threshold level has not occurred, and a second state that the voltage change greater than the selected threshold has occurred. Alternatively, the indicator can be configured to display additional information, such as multiple colors indicating different threshold levels, or a liquid crystal display capable of displaying alphanumeric or graphical information related to voltage levels, brownouts, blackouts, and so forth.

Figure 4:
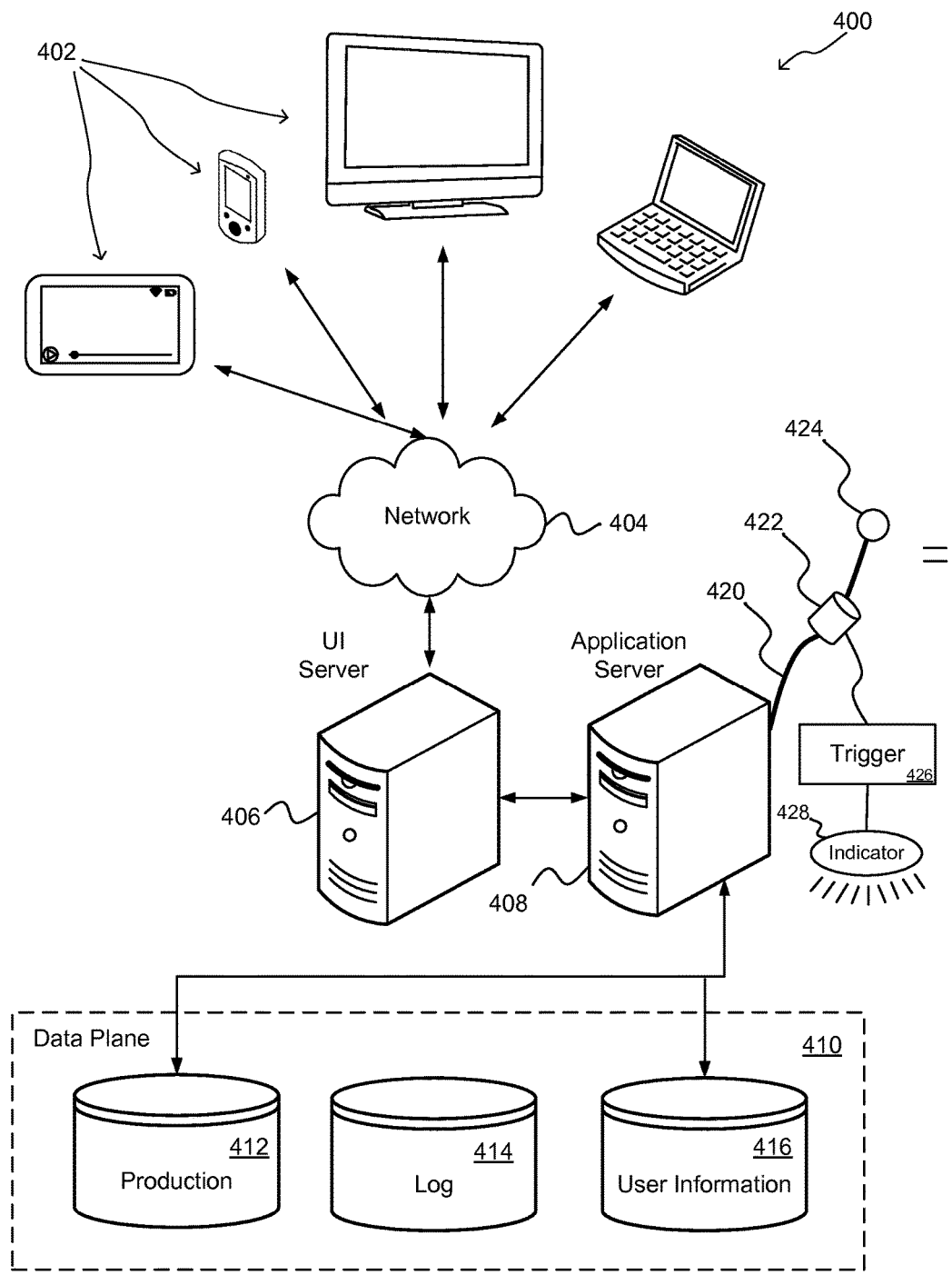
FIG. 4 is a diagram illustrating an example of an environment in which a non-intrusive power detection system may be used.

FIG. 4 illustrates an example of an environment 400 for implementing aspects in accordance with the described technology. Although a networked server based environment is used for purposes of explanation, different environments may be used, as appropriate, to implement various configurations. The environment may include at least one electronic client device 402, which may include any appropriate device operable to send and receive requests, messages, or information over an appropriate network 404 and convey information back to a user of the device. Examples of such client devices include personal computers, cell phones, handheld messaging devices, laptop computers, set-top boxes, personal data assistants, electronic book readers, and the like. The network may include any appropriate network, including an intranet, the internet, a cellular network, a local area network, or any other such network or combination thereof. Components used for such a system may depend at least in part upon the type of network and/or environment selected. Protocols and components for communicating via such a network are well known and will not be discussed herein in detail. Communication over the network may be enabled by wired or wireless connections, and combinations thereof. In this example, the network includes the internet, and the environment includes a user interface (UI) server 406 (e.g., a page server) for receiving requests and serving content in response thereto, although for other networks an alternative device serving a similar purpose could be used as would be apparent to one of ordinary skill in the art.

The illustrative environment includes at least one application server 408 and a data store 410. There may be several application servers, layers, or other elements, processes, or components, which may be chained or otherwise configured, which may interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any grid, distributed, or clustered environment.

The application server 408 may include any appropriate hardware and software for integrating with the data store as needed to execute aspects of one or more applications for the client device, and for handling a majority of the data access and business logic for an application. The application server 408 may provide access control services in cooperation with the data store 410, and may generate content such as text, graphics, audio, and/or video to be transferred to the user, which may be served to the user by the UI server 406 in the form of HTML, XML, or another appropriate structured language in this example. The handling of all requests and responses, as well as the delivery of content between the client device 402 and the application server 408, may be handled by the user interface (UI) server 406. The user interface 406 and application servers 408 are not required and are merely example components, as structured code discussed herein may be executed on any appropriate device or computing device as discussed elsewhere herein.

The data store 410 may include several separate data tables, databases, or other data storage mechanisms and media for storing data relating to a particular aspect of the application. For example, the data store illustrated includes mechanisms for storing production data 412 and user information 416, which may be used to serve content for the production side. The data store also is shown to include a mechanism for storing log data 414, which may be used for purposes such as reporting and analysis. It should be understood that there may be many other aspects that may need to be stored in the data store, such as page image information and access right information, which may be stored in any of the above listed mechanisms as appropriate or in additional mechanisms in the data store 410. The data store 410 is operable, through logic associated therewith, to receive instructions from the application server 408, and obtain, update, or otherwise process data in response thereto. In one example, a user might submit a search request for a certain type of item. In this case, the data store might access the user information to verify the identity of the user, and the data store may access the detail information to obtain information about items of that type for the search. The information then may be returned to the user, such as in a results listing on an electronic page that the user is able to view via a browser on the user device 402. Information for a particular item of interest may be viewed in a dedicated page or window of the browser.

Each server typically will include an operating system that provides executable program instructions for the general administration and operation of that server, and typically will include a computer-readable medium storing instructions that, when executed by a processor of the server, allow the server to perform its intended functions. Suitable implementations for the operating system and general functionality of the servers are known or commercially available, and are readily implemented by persons having ordinary skill in the art, particularly in light of the disclosure herein.

The power line or power cord 420 of the application server 408 may be monitored by a non-intrusive power detection system, such as one or more of the systems described in FIGS. 1-3. A non-intrusive power detector 422, such as a split core transformer and/or a non-contact voltage detector, may be placed in proximity of or electrically coupled to the power cord 420 that has a plug 424 that plugs into an AC power source (e.g., a wall socket, power strip or similar AC source) connected to the electrical grid. The non-intrusive power detector 422 may be coupled to a power change trigger 426 that may register when alternating current stops for a period of time or when voltage is outside of a preset threshold value. When the power change trigger 426 registers that the alternating current has stopped for a period of time or the voltage is outside of a threshold, the AC power change may be recorded. An indicator 528 coupled to the power change trigger 426 may indicate when the alternating current ceases based on an output of the power change trigger 426. This indicator 428 may be a visual indicator light, such as an LED (light emitting diode) or an incandescent light. Alternatively, the indicator 428 may be a chemically sensitive paper that changes color when a charge or current is received or another type of visual indicator. The indicator 428 may be lit until a user comes and resets the trigger 426. While the trigger and indicator are illustrated as being separate from the non-intrusive power detector 422, the trigger or indicator may also be integrated in the detector itself.

Thus, the non-intrusive power detection system may enable a system administrator to visually inspect computers or servers that are in a rack mounted housing or servers that are in a blade mounted configuration to identify servers that may have experienced a transient power failure. While many computers or servers in a data center configuration have sensors or monitors that are on-board the computer, difficulties may still exist in monitoring transient AC failure and this technology assists in monitoring such transient AC failures.

Of course the non-intrusive power detection system may monitor multiple computers or servers by monitoring an AC power source that powers multiple computers. For example, this technology may monitor an AC power source that powers an entire set of blade servers, an entire rack of servers, a group of racks or multiple rows of racks in a data center.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 4. Thus, the depiction of the system 400 in FIG. 4 should be taken as being illustrative in nature, and not limiting to the scope of the disclosure.

An environment such as that illustrated in FIG. 4 may be useful for an electronic marketplace or computer network, for example, wherein multiple hosts might be used to perform tasks such as serving content, executing large-scale computations, or performing any of a number of other such tasks. Some of these hosts may be configured to offer the same functionality, while other servers might be configured to perform at least some different functions. The hosts may be grouped together into clusters or other functional groups for the performance of specific tasks, such as may be provided as part of a data center, cloud computing offering, or processing service. The electronic environment in such cases might include additional components and/or other arrangements.

Some of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more blocks of computer instructions, which may be organized as an object, procedure, or function. Nevertheless, the executables of an identified module need not be physically located together, but may comprise disparate instructions stored in different locations which comprise the module and achieve the stated purpose for the module when joined logically together.

Indeed, a module of executable code may be a single instruction, or many instructions and may even be distributed over several different code segments, among different programs and across several memory devices. Similarly, operational data may be identified and illustrated herein within modules and may be embodied in any suitable form and organized within any suitable type of data structure. The operational data may be collected as a single data set, or may be distributed over different locations including over different storage devices. The modules may be passive or active, including agents operable to perform desired functions.

The technology described here may also be stored on a computer readable storage medium that includes volatile and non-volatile, removable and non-removable media implemented with any technology for the storage of information such as computer readable instructions, data structures, program modules, or other data. Computer readable storage media include, but is not limited to, non-transitory media such as RAM, ROM, EEPROM, flash memory or other memory technology, CD-ROM, digital versatile disks (DVD) or other optical storage, magnetic cassettes, magnetic tapes, magnetic disk storage or other magnetic storage devices, or any other computer storage medium which may be used to store the desired information and described technology.

The devices described herein may also contain communication connections or networking apparatus and networking connections that allow the devices to communicate with other devices. Communication connections are an example of communication media. Communication media typically embodies computer readable instructions, data structures, program modules and other data in a modulated data signal such as a carrier wave or other transport mechanism and includes any information delivery media. A "modulated data signal" means a signal that has one or more of its characteristics set or changed in such a manner as to encode information in the signal. By way of example and not limitation, communication media includes wired media such as a wired network or direct-wired connection and wireless media such as acoustic, radio frequency, infrared and other wireless media. The term computer readable media as used herein includes communication media.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A non-intrusive transient current detection system for an alternating current (AC) power cord, comprising:
   a split-core current transformer operable to wrap around at least one conductor of an alternating current (AC) power cord and configured to non-intrusively detect an alternating current in the AC power cord;
   a power outage trigger coupled to the split-core current transformer and configured to send an outage signal when the alternating current ceases; and
   an indicator coupled to the power outage trigger and a timer, wherein the indicator and the timer are configured to indicate when the alternating current ceases based on the outage signal received from the power outage trigger for a threshold amount of time after the outage signal.

2. The non-intrusive current detection system of claim 1, wherein the timer is coupled to the power outage trigger and the indicator, the timer being configured to communicate the outage signal to the indicator after the outage signal of the power outage trigger indicates the alternating current has ceased for the threshold amount of time.

3. The non-intrusive current detection system of claim 1, wherein the power outage trigger is at least one of a falling edge latch or a rising edge latch configured to output the outage signal to the timer, and the timer is configured to communicate the outage signal to the indicator after an output of the falling edge latch indicates that the alternating current has ceased for the threshold amount of time.

4. The non-intrusive current detection system of claim 1, wherein the indicator is a visual indicator of a current loss in the AC power cord.

5. The non-intrusive current detection system of claim 1, wherein the indicator is an audible indicator of a current loss in the AC power cord.

6. The non-intrusive current detection system of claim 1, wherein the power outage trigger is a falling edge latch configured to output the outage signal to the indicator when the alternating current in the AC power cord ceases.

7. A non-intrusive power detection system, comprising:
   a non-intrusive power detector configured to be electrically coupled to an alternating current (AC) power line to non-intrusively detect at least one of an alternating current or a voltage in the AC power line;
   a power change trigger coupled to the non-intrusive power detector and configured to detect a change in power in the AC power line; and
   an indicator coupled to the power change trigger and a timer, wherein the indicator and the timer are configured to indicate when a power change occurs based on an output of the power change trigger for a threshold amount of time after an outage signal from the power change trigger.

8. The non-intrusive power detection system of claim 7, wherein the timer is coupled to the power change trigger and the indicator, the output indicating that the power change comprises a change in at least one of the voltage or the alternating current in the AC power line for the threshold amount of time.

9. The non-intrusive power detection system of claim 7, wherein the non-intrusive power detector is a split-core current transformer configured to detect a magnetic field emitted by the AC power line, wherein the magnetic field is proportional to the alternating current in the AC power line.

10. The non-intrusive power detection system of claim 7, wherein the non-intrusive power detector is a capacitively coupled AC voltage detector configured to non-intrusively detect a voltage in the AC power line.

11. The non-intrusive power detection system of claim 7, wherein the non-intrusive power detector is at least one of:
   a current detector that is electrically coupled to an electrical outlet in a power strip that is connected to an electrical grid; or a voltage detector that is electrically coupled to the electrical outlet in the power strip that is connected to the electrical grid.

12. The non-intrusive power detection system of claim 7, wherein the power change trigger is a falling edge latch configured to output a signal to the indicator when the alternating current in the AC power line ceases.

13. The non-intrusive power detection system of claim 7, wherein the power change trigger is triggered when the voltage is less than a first voltage threshold or greater than a second voltage threshold.

14. The non-intrusive power detection system of claim 7, wherein the power change trigger is triggered when the current is less than a first current threshold or greater than a second current threshold.

15. The non-intrusive power detection system of claim 7, wherein the indicator is at least one of:
  a visual indicator of a power loss in the AC power line; or
  an audible indicator of a power loss in the AC power line.

16. A non-intrusive voltage detection system for an alternating current (AC) power line, comprising:
  a capacitively coupled AC voltage detector configured to non-intrusively detect a voltage in the AC power line, wherein the detected voltage is proportional to a voltage in the AC power line;
  a voltage change detector coupled to the capacitively coupled AC voltage detector and configured to detect a change in voltage in the AC power line;
  an indicator coupled to the voltage change detector and a timer, wherein the indicator is configured to indicate when the voltage changes more than a selected threshold based on an output of the voltage change detector; and
  a timer coupled to the voltage change detector and the indicator, the timer being configured to communicate a voltage change signal to the indicator after an output of the voltage change detector indicates the voltage has changed for more than the selected threshold for a predetermined amount of time.

17. The non-intrusive voltage detection system of claim 16, wherein the timer is configured to filter brief changes in the voltage in the AC power line.

18. The non-intrusive voltage detection system of claim 16, wherein the indicator is configured to indicate at least one of a blackout or a brownout based on the detected change in voltage in the AC power line.

19. The non-intrusive voltage detection system of claim 16, wherein the indicator is a visual indicator of a voltage change in the AC power line.

20. The non-intrusive voltage detection system of claim 16, wherein the indicator is an audible indicator of a voltage change in the AC power line.

* * * * *